(12) United States Patent
Araki et al.

(10) Patent No.: US 7,388,411 B2
(45) Date of Patent: *Jun. 17, 2008

(54) SEMICONDUCTOR INTEGRATED CIRCUIT DEVICE AND SEMICONDUCTOR INTEGRATED CIRCUIT SYSTEM

(75) Inventors: Yuta Araki, Osaka (JP); Isao Tanaka, Osaka (JP); Masaya Sumita, Hyogo (JP)

(73) Assignee: Matsushiita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/797,951

(22) Filed: May 9, 2007

(65) Prior Publication Data

US 2007/0216450 A1  Sep. 20, 2007

Related U.S. Application Data

(62) Division of application No. 11/116,220, filed on Apr. 28, 2005, now Pat. No. 7,227,391.

(30) Foreign Application Priority Data

Apr. 28, 2004 (JP) ............................. 2004-132817

(51) Int. Cl.
*H03B 1/00* (2006.01)
*H03K 3/00* (2006.01)

(52) U.S. Cl. ................ 327/108; 327/112; 327/424; 318/430; 318/434

(58) Field of Classification Search ................. None
See application file for complete search history.

(56) References Cited

U.S. PATENT DOCUMENTS

| 4,725,765 | A | 2/1988 | Miller |
| 4,985,666 | A | 1/1991 | Nakabayashi |
| 5,264,767 | A | 11/1993 | Chin et al. |
| 5,325,258 | A | 6/1994 | Choi et al. |
| 5,457,364 | A | 10/1995 | Bilotti et al. |
| 5,712,550 | A | 1/1998 | Boll et al. |
| 5,896,057 | A | 4/1999 | Chicca et al. |
| 5,917,360 | A | 6/1999 | Yasutake |
| 6,016,042 | A | 1/2000 | Miura et al. |
| 6,392,373 | B1 | 5/2002 | Glasgow et al. |
| 7,084,594 | B2 | 8/2006 | Itabashi et al. |

FOREIGN PATENT DOCUMENTS

JP  63-169120  7/1988

*Primary Examiner*—Tuan T Lam
(74) *Attorney, Agent, or Firm*—McDermott Will & Emery LLP (57) ABSTRACT

A semiconductor integrated circuit device according to the present invention includes: a sample circuit in which through current to be monitored flows during switching between transistors; a non-overlap circuit for outputting an output signal for the switching in the sample circuit; a current detector for detecting the through current flowing during the switching; and a current comparator in which a reference current value with respect to the through current has been set and which compares a current value detected by the current detector with the reference current value and outputs a result of the comparison to the non-overlap circuit.

1 Claim, 11 Drawing Sheets

| POWER SUPPLY VOLTAGE [V] | REFERENCE CURRENT VALUE [μA] |
|---|---|
| 3.5~4 | 50 |
| 3~3.5 | 40 |
| 2.5~3 | 30 |
| 2~2.5 | 20 |
| 1.5~2 | 10 |
| 1~1.5 | 5 |
| 0.5~1 | 2 |

SEMICONDUCTOR INTEGRATED CIRCUIT DEVICE AND SEMICONDUCTOR INTEGRATED CIRCUIT SYSTEM

RELATED APPLICATIONS

This application is a divisional of application Ser. No. 11/116,220, filed on Apr. 28, 2005, now U.S. Pat. No. 7,227,391, which claims priority of Japanese Application No. 20041-132817, filed Apr. 28, 2004, the contents of which are hereby incorporated by reference.

BACKGROUND OF THE INVENTION

The present invention relates to techniques for increasing operation speed of semiconductor integrated circuit devices and semiconductor integrated circuit systems.

In recent years, the integration degrees of semiconductor integrated circuit devices and semiconductor integrated circuit systems have increased and power consumption thereof have been reduced with miniaturization of semiconductor elements such as transistors mounted thereon. However, with the increase of integration degree and the reduction of power consumption, through current (leakage current) in a semiconductor integrated circuit has a greater influence on power consumption of a system.

To reduce through current, a technique for changing the timing of switching between transistors is disclosed in, for example, Japanese Unexamined Patent Publication (Kokai) No. 63-169120.

In this conventional technique, the timing of switching is set at the design stage. Therefore, a margin is previously estimated when the timing of switching is set. However, if this margin is too large, operation speed might decrease.

SUMMARY OF THE INVENTION

It is therefore an object of the present invention to provide a semiconductor integrated circuit device and a semiconductor integrated circuit system both operating at high speed.

A semiconductor integrated circuit device according to the present invention includes: a sample circuit in which through current to be monitored flows during switching between transistors; a non-overlap circuit for outputting an output signal for the switching in the sample circuit; a current detector for detecting the through current flowing during the switching; and a current comparator in which a reference current value with respect to the through current has been set and which compares a current value detected by the current detector with the reference current value and outputs a result of the comparison to the non-overlap circuit.

According to the present invention, an adjustment is made to cause the non-overlap circuit to output an output signal for switching at a timing at which through current in the sample circuit has a value according to the reference current value. Accordingly, unlike conventional techniques, it is unnecessary to set the timing of switching at the design stage. This eliminates the need of previously estimating a margin when setting the timing of switching, so that decrease of operation speed caused by an excessive margin is prevented. That is, according to the present invention, a semiconductor integrated circuit device operating at high speed is implemented.

The non-overlap circuit includes one of: a delay circuit for setting a delay time of the output signal for the switching based on the comparison result output from the current comparator; and a buffer for setting a transition time of the output signal for the switching.

With this configuration, the timing of switching in the sample circuit is adjusted by setting the delay time or the transition time.

If the non-overlap circuit includes both of the delay circuit and the buffer, and the delay circuit and the buffer preferably set the delay time and the transition time, respectively, of the output signal for the switching such that an average power supply current value is smallest upon a supply of a power supply current, then power consumption is reduced.

Each of the delay circuit and the buffer may include a plurality of transistors connected in parallel and having different channel widths and different channel lengths, an ability of each of the delay circuit and the buffer may be changed by selecting at least one of the transistors, and the delay time or the transition time of the output signal for the switching in the sample circuit may be adjusted by the change of the ability.

Alternatively, each of the delay circuit and the buffer may include a transistor, and the delay time or the transition time of the output signal may be adjusted by changing a substrate potential of the transistor.

The reference current value may be set according to a power supply voltage, a temperature condition and a frequency of an input signal to the non-overlap circuit.

If the semiconductor integrated circuit device further includes storage means for storing a delay time or a transition time of the output signal for the switching, it is unnecessary to operate the current detector and the current comparator as long as the delay time or the transition time of the output signal for switching has been stored in the storage means beforehand.

The semiconductor integrated circuit device may further include a phase difference comparator in which a reference phase difference between input signals to the sample circuit has been set and which detects a phase difference between the input signals to the sample circuit. The phase difference between the input signals to the sample circuit is adjusted by the phase difference comparator to be equal to the reference phase difference.

The reference phase difference may be set in the phase difference comparator from an outside.

The current detector may calculate a difference between the current value detected by the current detector and the reference current value and may adjust a phase difference between input signals to the sample circuit in accordance with the calculated difference.

The reference current value may be set in the current detector from an outside.

The semiconductor integrated circuit device may further include a limiter for limiting the phase difference comparator so that that the phase difference between the input signals to the sample circuit is equal to or smaller than a predetermined value.

A semiconductor integrated circuit system according to the present invention includes a semiconductor integrated circuit device including: the sample circuit; a non-overlap circuit connected to the sample circuit and outputting an output signal for switching in the sample circuit; a current detector connected to the sample circuit and detecting through current flowing during the switching in the sample circuit; and a current comparator connected to the current detector and comparing a current value detected by the current detector with a reference current value previously set therein and outputting a result of the comparison to the non-overlap circuit. The semiconductor integrated circuit system further includes an internal circuit receiving an output signal from the non-overlap circuit.

According to the present invention, even if a plurality of internal circuits are provided, the semiconductor integrated circuit device is capable of setting the timings of switching in the respective internal circuits. That is, according to the present invention, a semiconductor integrated circuit device for setting the switching timing does not need to be provided in each of the internal circuits, so that the space occupied by the semiconductor integrated circuit system is reduced.

The semiconductor integrated circuit system may further include a monitor for monitoring one of power consumption, a workload and an average current value of the system.

The semiconductor integrated circuit device may operate according to an operation mode of the semiconductor integrated circuit system.

DESCRIPTION OF THE PREFERRED EMBODIMENTS

Hereinafter, embodiments of the present invention will be described with reference to the drawings. Each component common to the embodiments is denoted by the same reference numeral for simplicity.

Embodiment 1

Figure 1:
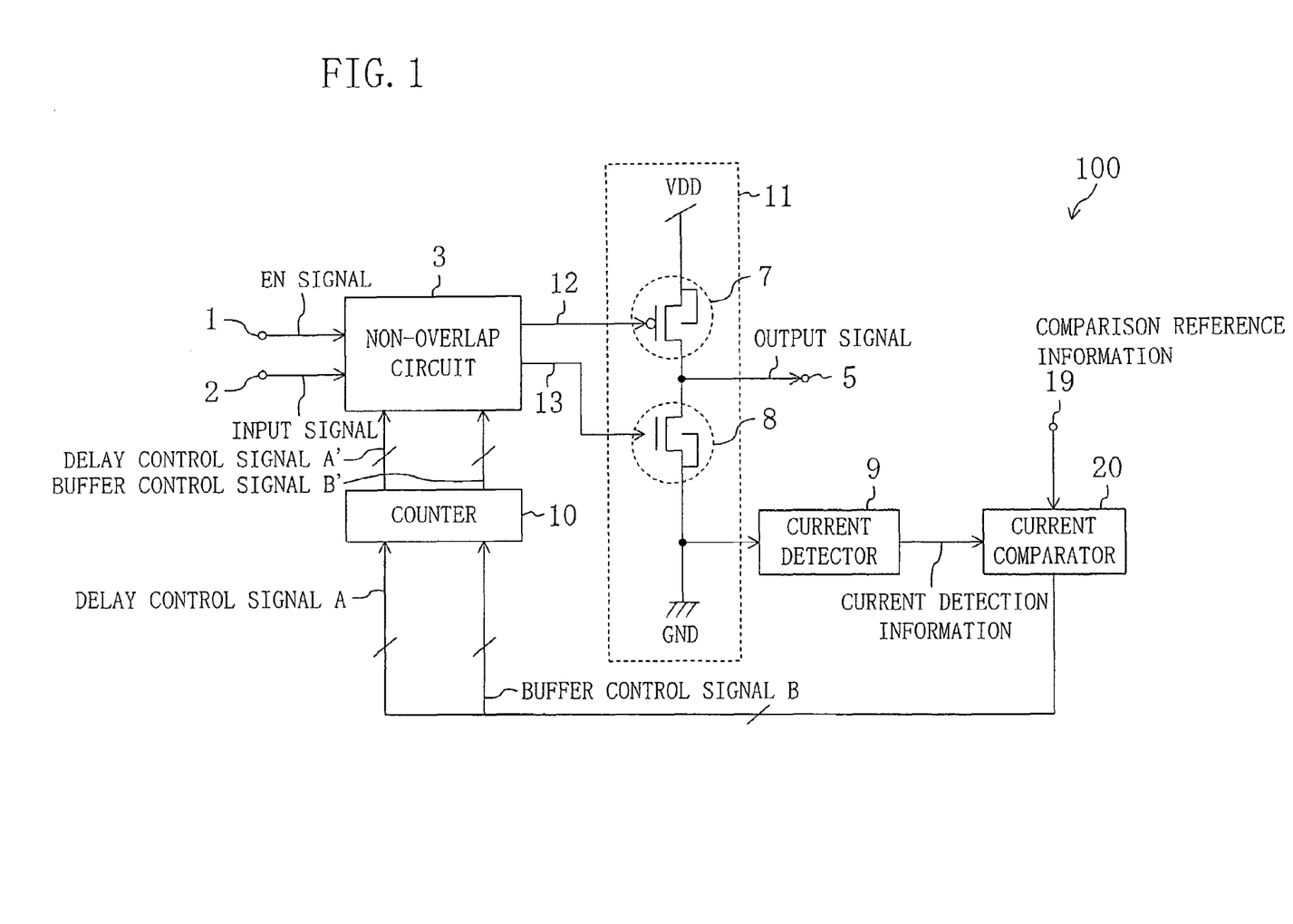
FIG. 1 is a block diagram illustrating a configuration of a semiconductor integrated circuit device according to a first embodiment of the present invention.

FIG. 1 is a block diagram illustrating a configuration of a semiconductor integrated circuit device according to a first embodiment of the present invention.

As shown in FIG. 1, a semiconductor integrated circuit device 100 of this embodiment includes: a non-overlap circuit 3; a sample circuit 11; a current detector 9; a counter 10; and a current comparator 20.

The non-overlap circuit 3 includes: input terminals 1 and 2; and output nodes 12 and 13. The input terminal 1 receives an enable signal (hereinafter, referred to as EN signal). The input terminal 2 receives an input signal for performing actual circuit operation. The non-overlap circuit 3 will be more specifically described later.

The sample circuit 11 includes: a p-channel type transistor 7 (hereinafter referred to as a p-transistor 7); an n-channel type transistor 8 (hereinafter referred to as an n-transistor 8); and an output terminal 5, for example. The p-transistor 7 has its source connected to a power supply (VDD) and its drain connected to the drain of the n-transistor 8. The n-transistor 8 has its source grounded (GND). The drains of the p-transistor 7 and the n-transistor 8 are connected to the output terminal 5. The substrate and the source of each of the transistors are connected to each other. The output nodes 12 and 13 of the non-overlap circuit 3 are connected to the respective gates of the p-transistor 7 and the n-transistor 8 in the sample circuit 11. The configuration of the sample circuit 11 is not limited to that described in this embodiment and the output terminal 5 may be precharged by an input from the output node 12 or discharged by an input from the output node 13.

The current detector 9 receives current flowing between the n-transistor 8 and the GND in the sample circuit 11 and outputs current detection information.

The current comparator 20 generates comparison reference information from comparison reference information input from an input terminal 19 and the current detection information from the current detector 9, and outputs a delay control signal A and a buffer control signal B.

The counter 10 receives the delay control signal A and the buffer control signal B output from the current comparator 20, counts these received signals, and outputs a delay control signal A' and a buffer control signal B'.

Figure 2:
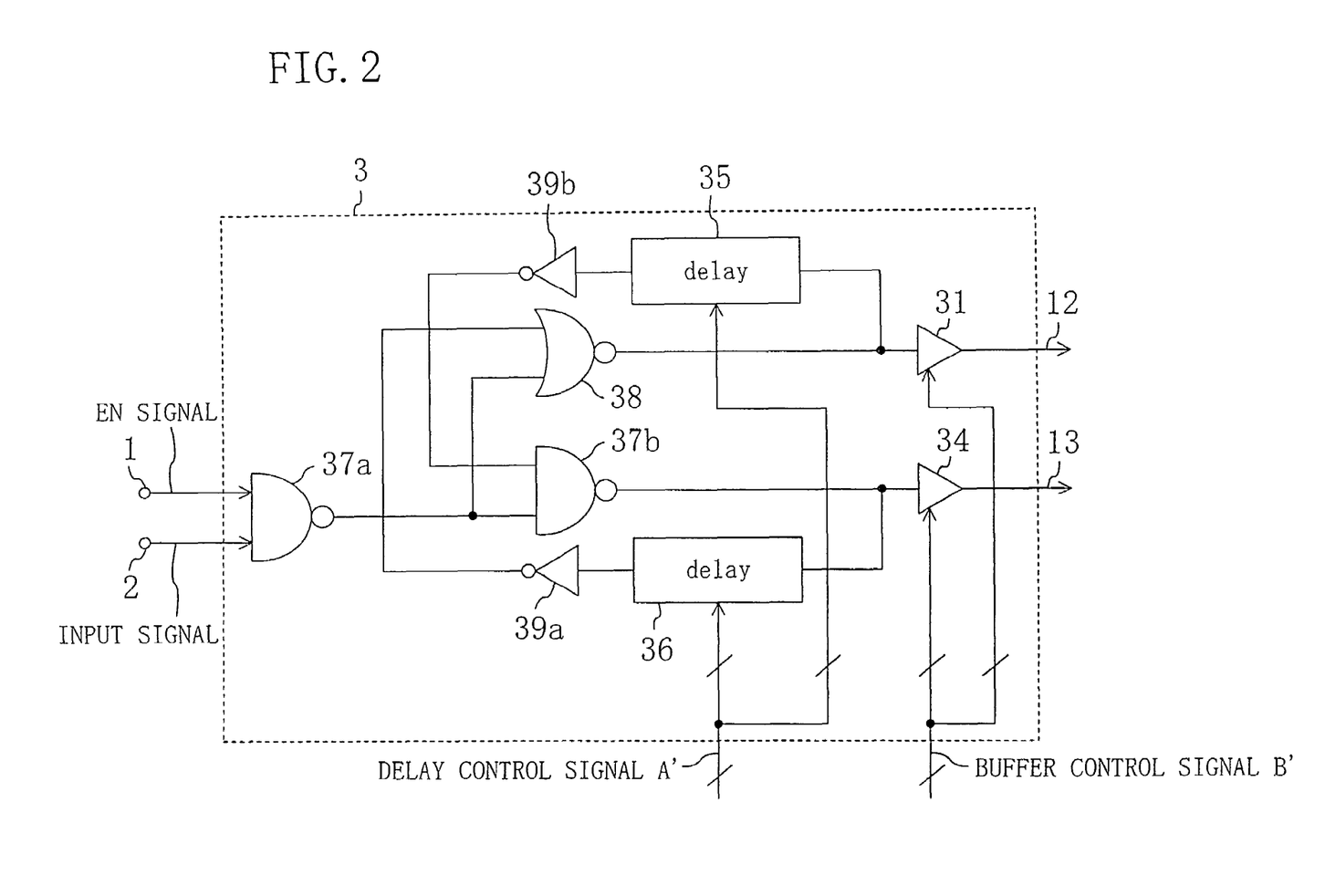
FIG. 2 is a diagram illustrating a configuration of a non-overlap circuit.

FIG. 2 is a diagram illustrating a configuration of the non-overlap circuit 3. As shown in FIG. 2, the non-overlap circuit 3 includes: NAND circuits 37a and 37b; a NOR circuit 38; INV circuits 39a and 39b; delay circuits 35 and 36; and buffers 31 and 34. The non-overlap circuit 3 receives an EN signal from the input terminal 1, an input signal from the input terminal 2 and the delay control signal A' and the buffer control signal B' from the counter 10, and outputs these signals from the output nodes 12 and 13.

As shown in FIG. 2, the NAND circuit 37a has its inputs connected to the input terminals 1 and 2 and its output connected to the inputs of the respective NAND circuit 37b and the NOR circuit 38.

The NOR circuit 38 and the NAND circuit 37b have their inputs connected to the NAND circuit 37a and have their outputs connected to the output nodes 12 and 13 via the buffers 31 and 34, respectively. The outputs of the NOR circuit 38 and the NAND circuit 37b have branches before the buffers 31 and 34, respectively, and these branches are connected to the inputs of the delay circuits 35 and 36, respectively.

The delay circuits 35 and 36 have their outputs connected to the inputs of the NAND circuit 37b and the NOR circuit 38, respectively, via the INV circuits 39a and 39b, respectively, and receive the delay control signal A'.

This non-overlap circuit 3 is capable of adjusting the timings of output signals from the output nodes 12 and 13 according to the settings of the delay circuits 35 and 36 and the buffers 31 and 34.

Now, a configuration of the delay circuits 35 and 36 and the buffers 31 and 34 will be described with reference to FIGS. 3A through 3C.

Figure 3A:
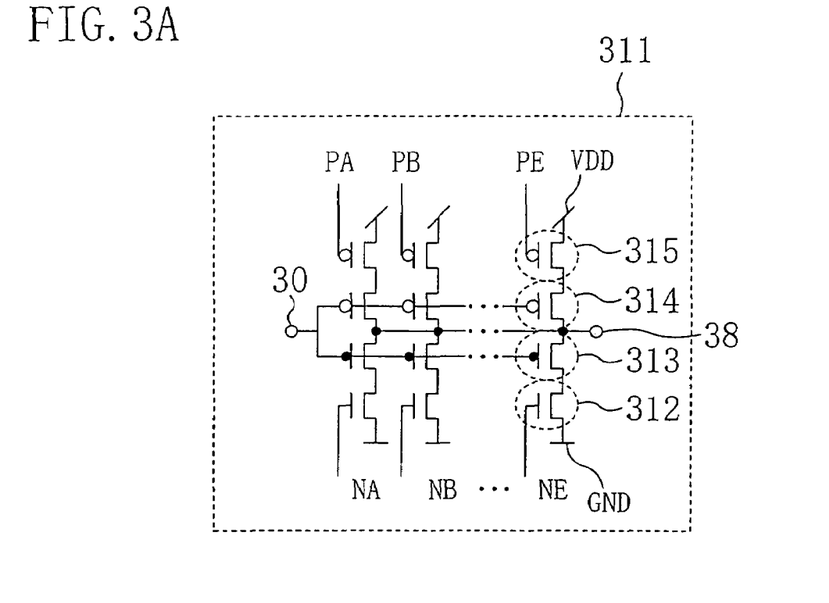
FIGS. 3A and 3B are diagrams illustrating inner configurations of a delay circuit shown in FIG. 2.
Figure 3B:
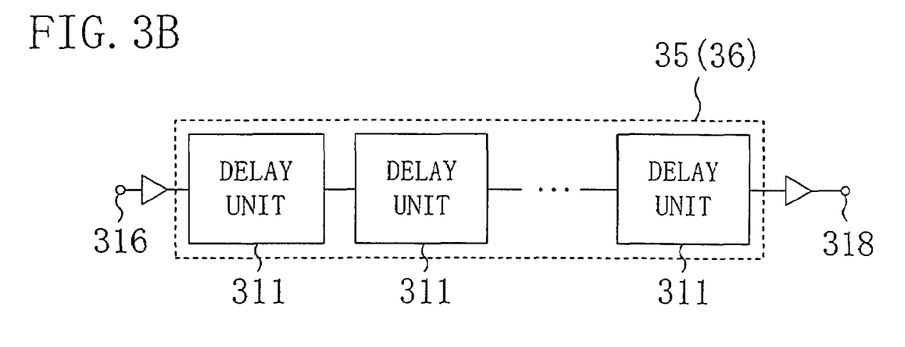

FIGS. 3A and 3B illustrate internal configurations of the delay circuits 35 and 36 shown in FIG. 2. As shown in FIGS. 3A and 3B, the delay circuit 35 (36) has a configuration in which a plurality of delay units 311 are connected in series.

As shown in FIG. 3A, each of the delay units 311 is constituted by a plurality of stages. Each of the stages includes: a p-transistor 314 for precharging an output terminal 38; an n-transistor 313 for discharging the output terminal 38; a p-select transistor 315 for selecting an application of a power supply voltage VDD to the p-transistor 314 in accordance with an input signal to the gate thereof; and an n-select transistor 312 for selecting an application of a ground potential GND to the n-transistor 313 in accordance with an input signal to the gate thereof. More specifically, each stage of the delay unit 311 includes: an inverter composed of the p-transistor 314 and the n-transistor 313; and the p-select transistor 315 and the n-select transistor 312 connected to the inverter. The channel lengths of the p-transistor 314 and the n-transistor 313 differ from one inverter to another. The gates of the p-transistors 314 and the n-transistors 313 are connected to a common input terminal 30. The drains of the p-transistors 314 and the n-transistors 313 are connected to the common output terminal 38.

Signals to be input to the gates of the p-select transistors 315 and the n-select transistors 312 are controlled in accordance with select signals PA, PB, . . . and PE and NA, NB, . . . NE, which differ from one stage to another in the parallel stages. The signal NA is an inverted signal of the signal PA and the same holds true for all the other stages.

With the foregoing configuration, in the delay circuit 35 (36) of this embodiment, at least one inverter is selected out of the inverters having different channel lengths of transistors in accordance with the select signals PA, PB, . . . and PE and NA, NB, . . . and NE so that the channel lengths of transistors constituting the delay unit 311 are changed and thereby the timing between an input signal to an input terminal 316 and an output signal from an output terminal 318 is adjusted.

Figure 3C:
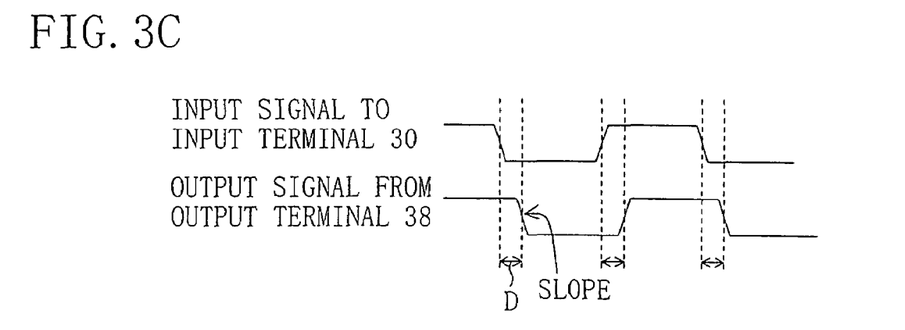
FIG. 3C is a timing chart showing an input signal to an input terminal and an output signal from an output terminal in a delay unit.

FIG. 3C is a timing chart showing an input signal to the input terminal 30 and an output signal from the output terminal 38 in one of the delay units 311 of this embodiment. As shown in FIG. 3C, a constant delay time (a delay value D) is present between the input terminal 30 and the output terminal 38. This delay value D can be adjusted as described above in accordance with the select signals PA, PB, . . . and PE and NA, NB, . . . and NE. If the channel widths of the p-transistor 314 and the n-transistor 313 differ from one inverter to anther, the channel widths of transistors constituting one or more selected inverters in the delay unit 311 are also changed in accordance with the select signals PA, PB, . . . and PE and NA, NB, . . . and NE.

In this embodiment, the circuit configuration of the delay circuits 35 and 36 is described with reference to FIGS. 3A through 3C. However, the delay circuits 35 and 36 only need to have a configuration in which the channel lengths and channel widths are controlled according to signals. The circuit configurations of the delay circuits 35 and 36 of this embodiment are similar to those of the buffers 31 and 34. Only by changing the channel lengths and channel widths of transistors in inverters, the slopes of an output signal shown in FIG. 3C, i.e., transition times (rise and fall times) of the output signal, are changed.

Now, operation of the semiconductor integrated circuit device 100 of this embodiment will be described with reference to FIG. 1.

(Timing Generation Step)

With the configuration of the non-overlap circuit 3 shown in FIG. 1, when the EN signal is "H", the non-overlap circuit 3 starts operating, generates output signals at timings different between the output node 12 and the output node 13 in accordance with the input signal input to the input terminal 2, and outputs the generated output signals to the sample circuit 11.

(Current Detection Step)

The output signals generated at the timing generation step are input from the output nodes 12 and 13 to the gates of the p-transistor 7 and the n-transistor 8 in the sample circuit 11. The sample circuit 11 outputs values according to the output signals received from the output nodes 12 and 13 to the output terminal 5. At this time, in the sample circuit 11, through current flowing in the source of the n-transistor 8 during switching is input to the current detector 9. The current detector 9 detects the through current and outputs current detection information on the detected current.

(Current Comparison Step)

The current comparator 20 compares the current detection information detected at the current detection step based on comparison reference information input from the input terminal 19 and outputs comparison result information as a delay control signal A and a buffer control signal B.

(Counter Step)

The counter 10 counts the delay control signal A and the buffer control signal B output at the current comparison step and outputs converted information (counter values) as a delay control signal A' and a buffer control signal B'.

(Feedback Step)

The delay control signal A' output at the counter step is input to the delay circuits 35 and 36 in the non-overlap circuit 3 and the buffer control signal B' is input to the buffers 31 and 34 so that delay ability (the delay value D) and buffer ability (the slopes of the output signal) are adjusted.

The timing generation step, the current detection step, the current comparison step, the counter step and the feedback step are performed in cycles, so that the delay circuits 35 and 36 and the buffers 31 and 34 in the sample circuit 11 are adjusted to optimum timings at which no through current flows. That is, unlike conventional techniques, the semiconductor integrated circuit device 100 of this embodiment does not need to set the timing of switching during the design stage. Accordingly, in setting the timing of switching, it is unnecessary to previously estimate a margin, so that decrease of operation speed caused by an excessive margin is prevented. That is, in this embodiment, a semiconductor integrated circuit device exhibiting low power consumption and operating at high speed is implemented.

In the semiconductor integrated circuit device 100 of this embodiment, after the counter 10 has been set so as not to cause through current to flow, operation of the current detector 9 and the current comparator 20 are stopped, resulting in reduction of power consumption.

Now, a typical structure of the current comparison step will be described.

In the current comparison step, a correlation between conditions such as a power supply voltage, temperature and the frequency of an input signal and the value of through current (through current value) is input as comparison reference information and then is compared with current detection information by the current comparator 20. In this manner, an optimum reference current value with respect to the conditions such as the power supply voltage, the temperature, the frequency of the input signal is capable of being used for the comparison. The reference current value can be set with respect to one of the conditions such as the power supply voltage, the temperature and the frequency of the input signal or may be set in consideration of these conditions.

Figure 4:
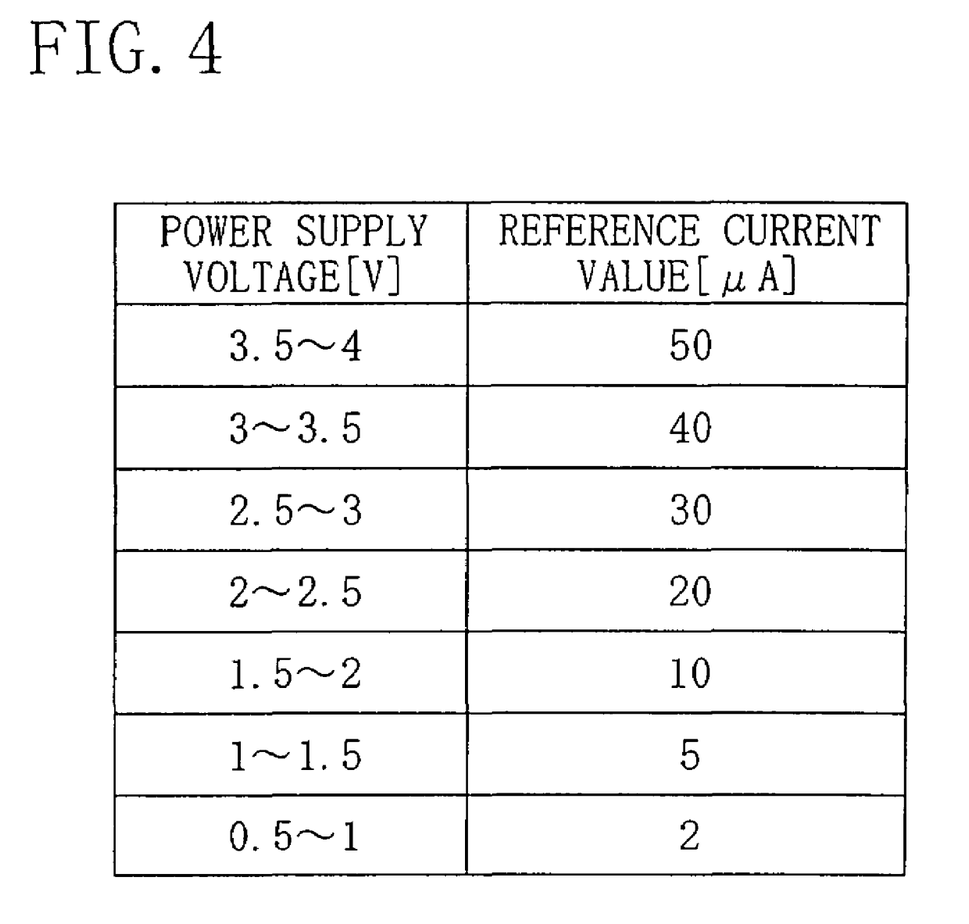
FIG. 4 is a table showing a correlation between a power supply voltage and a reference current value.

FIG. 4 is a table showing a correlation between a power supply voltage and a reference current value. For example, if the table shown in FIG. 4 is prepared and set as comparison reference information, it is possible to set the reference current value in accordance with the power supply voltage. This enables through current to be efficiently reduced according to the power supply voltage. With respect to the temperature and the frequency of the input signal, if tables similar to that shown in FIG. 4 are prepared and the reference current value is set accordingly, the same advantages are obtained.

In this embodiment, adjustments are performed on the delay circuits 35 and 36 and the buffers 31 and 34 at the feedback step (a delay buffer feedback method). However, the present invention is not limited to this. Feedback may be given only to the delay circuits 35 and 36 (a delay feedback method) or only to the buffers 31 and 34 (a buffer feedback method).

In this embodiment, the delay buffer feedback method is adopted, and a plurality of combinations of timing settings of delay circuits and buffers with which the timings of output signals from the delay circuits and the buffers are set at the same timings as output signals from the output nodes 12 and 13 are provided. In view of this, if the delay circuits and the buffers are adjusted so as to optimize a power supply current value, power consumption is reduced. Accordingly, if power supply current is monitored for every combination of settings of the delay circuits and buffers and a combination exhibiting the smallest amount of average power supply current is selected, power consumption is further reduced by setting the timings of the output nodes 12 and 13 so as to reduce through current and also by selecting a combination of delay circuits and buffers exhibiting minimum power consumption.

Embodiment 2

In a second embodiment of the present invention, another configuration of the delay circuits 35 and 36 and the buffers 31 and 34 in the semiconductor integrated circuit device 100 of the first embodiment will be described with reference to FIGS. 5A through 5C.

Figure 5A:
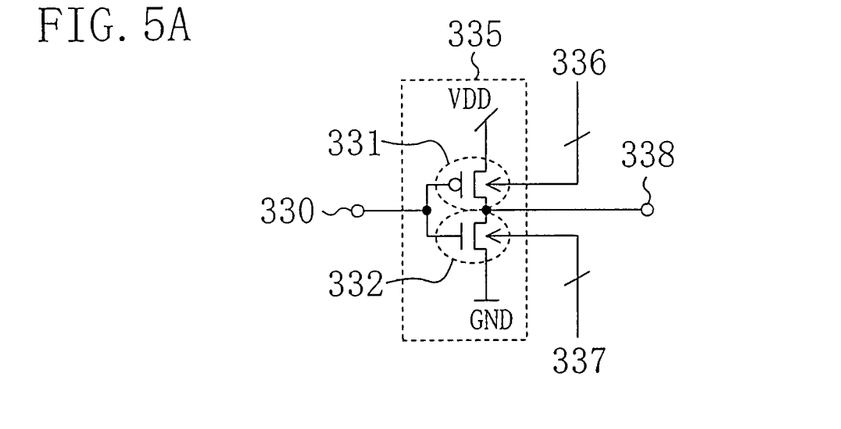
FIGS. 5A and 5B are diagrams illustrating configurations of a delay circuit shown in FIG. 2.
Figure 5B:
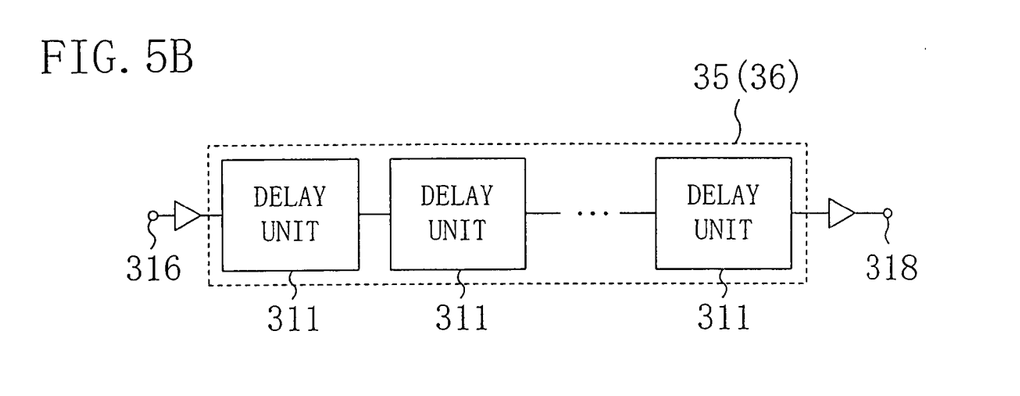

FIGS. 5A and 5B illustrate internal configurations of the delay circuits 35 and 36 shown in FIG. 2. As shown in FIGS. 5A and 5B, the delay circuit 35 (36) has a configuration in which a plurality of delay units 335 are connected to each other.

Each of the delay units 335 includes: a p-transistor 331 for precharging an output terminal 338 to a power supply voltage VDD according to an input signal from an input terminal 330; and an n-transistor 332 for discharging the output terminal 338 to a ground potential GND according to the input signal from the input terminal 330. The p-transistor 331 has its substrate connected to a node 336 and the n-transistor 332 has its substrate connected to a node 337.

Figure 5C:
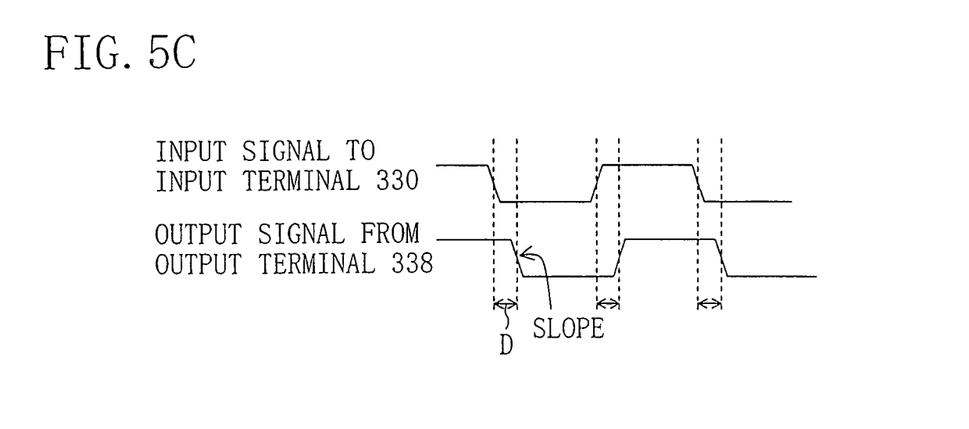
FIG. 5C is a timing chart showing an input signal to an input terminal and an output signal from an output terminal in a delay unit.

FIG. 5C is a timing chart showing an input signal to the input terminal 330 and an output signal from the output terminal 338 in each of the delay units 335 of this embodiment. Each of the delay units 335 is capable of adjusting delay time or slopes of the output signal from the output terminal 338 with respect to the input signal as shown in FIG. 5C by changing voltages (i.e., substrate potentials) applied to the nodes 336 and 337. By utilizing this configuration, the delay circuits 35 and 36 are capable of adjusting the timings at an input 316 and an output 318.

Embodiment 3

Figure 6:
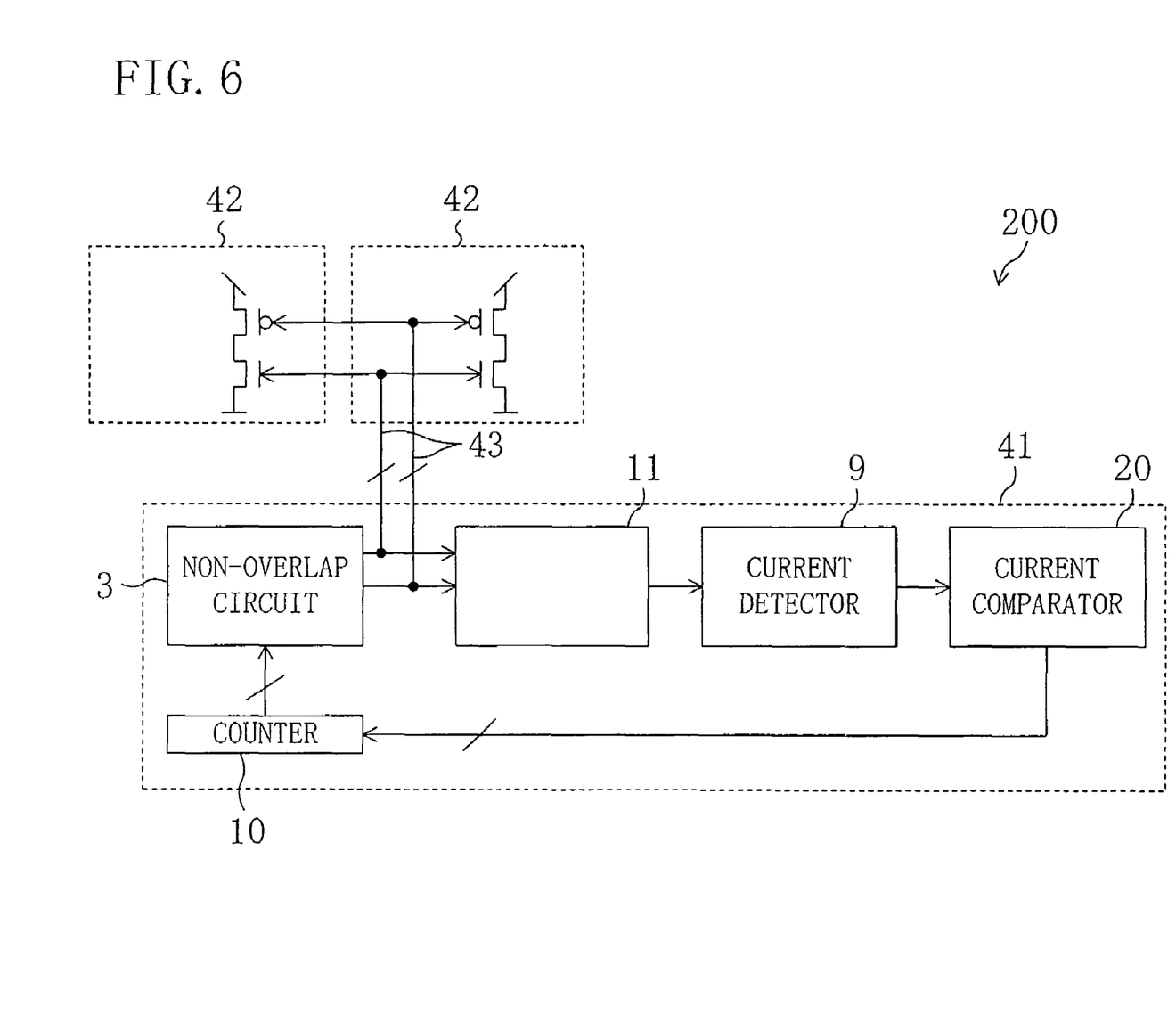
FIG. 6 is a block diagram illustrating a configuration of a semiconductor integrated circuit device according to a third embodiment of the present invention.

FIG. 6 is a block diagram illustrating a configuration of a semiconductor integrated circuit system according to a third embodiment of the present invention. As shown in FIG. 6, the semiconductor integrated circuit system 200 of this embodiment includes a replica circuit 41 and internal circuits 42.

The replica circuit 41 includes: a non-overlap circuit 3; a sample circuit 11; a current detector 9; a counter 10; and a current comparator 20. That is, the replica circuit 41 has exactly the same configuration as that of the semiconductor integrated circuit device 100 of the first embodiment. Accordingly, the replica circuit 41 outputs an output signal to n-transistor and p-transistor of the internal circuits 42 (e.g., inverters in this embodiment), respectively, via lines 43 divided as output nodes 12 and 13 of the non-overlap circuit 3 (see FIG. 1) at an optimum timing at which no through current flows.

With the configuration of this embodiment, even in a case where a plurality of internal circuits 42 are provided, the timing of switching in each of the internal circuits 42 is set by using one replica circuit 41. That is, in this embodiment, it is unnecessary to provide the semiconductor integrated circuit device 100 of the first embodiment in each of the internal circuits 42 in order to set the timing of switching. As a result, the space occupied by the semiconductor integrated circuit system 200 is reduced.

Embodiment 4

A semiconductor integrated circuit device according to a fourth embodiment of the present invention will be described with reference to FIGS. 7A and 7B.

Figure 7A:
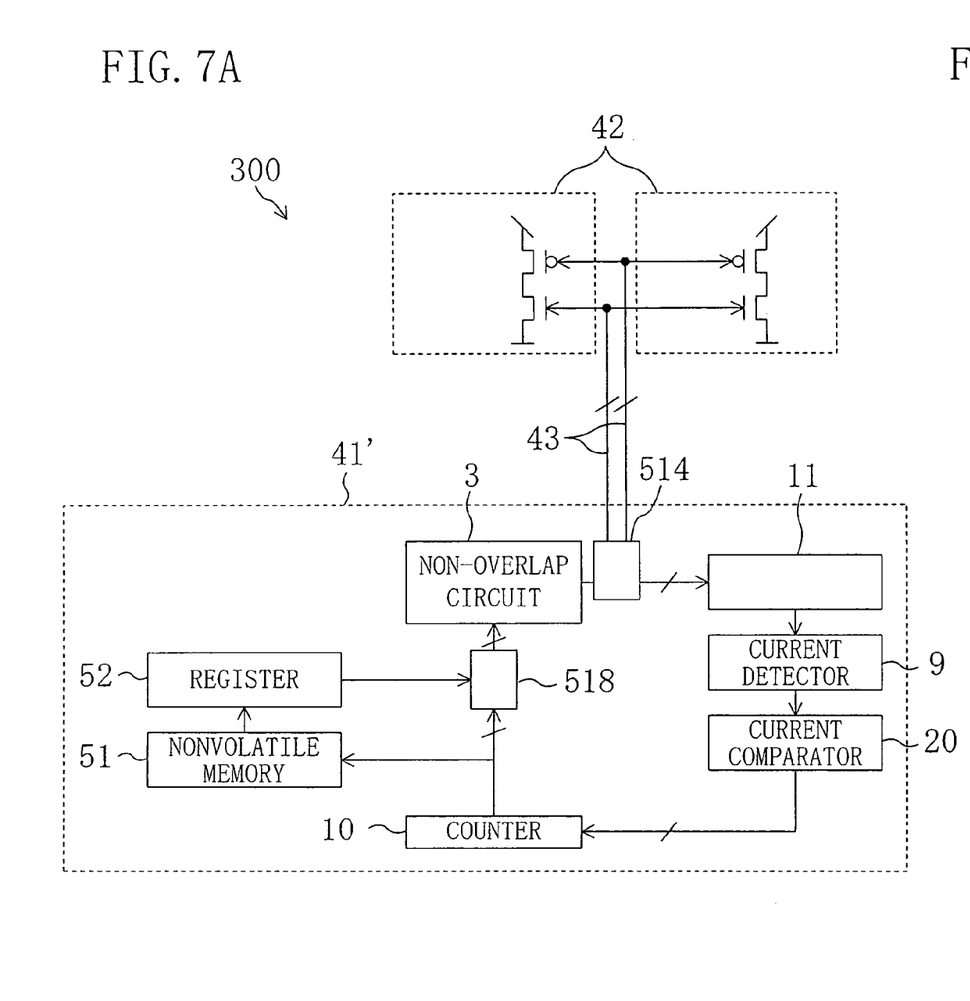
FIG. 7A is a block diagram illustrating a configuration of a semiconductor integrated circuit device according to a fourth embodiment of the present invention.

FIG. 7A is a block diagram illustrating a configuration of a semiconductor integrated circuit system 300 according to this embodiment. As shown in FIG. 7A, the semiconductor integrated circuit system 300 of this embodiment includes a replica circuit 41 and internal circuits 42.

The replica circuit 41' includes: selectors 514 and 518; a nonvolatile memory 51; and a register 52, in addition to the components of the replica circuit 41 of the third embodiment. The selector 514 has its input connected to output nodes 12 and 13 of a non-overlap circuit 3 (see FIG. 1) and its outputs connected to lines 43 and a sample circuit 11. The selector 518 has its inputs connected to the outputs of a counter 10 and the register 52 and its output connected to the non-overlap circuit 3.

The nonvolatile memory 51 has its input connected to a branch of the output of the counter 10 toward the selector 518 and its output connected to the input of the register 52. The output of the register 52 is connected to the selector 518.

In this embodiment, the replica circuit 41' also outputs an output signal to n-transistor and p-transistor of the respective internal circuits 42 (e.g., inverters in this embodiment), respectively, via the lines 43 divided between the output nodes 12 and 13 at an optimum timing at which no through current flows.

Now, operation of the semiconductor integrated circuit system 300 of this embodiment will be described with reference to FIGS. 7A and 7B. FIG. 7B is a flowchart showing operation of the semiconductor integrated circuit system 300 of this embodiment. In the following description, it is assumed that the semiconductor integrated circuit system 300 shown in FIG. 7A is implemented on one chip.

(Counter Value Determination Step)

First, in a test for shipment, the semiconductor integrated circuit system 300 operates the replica circuit 41' with an EN signal to the non-overlap circuit 3 set at "H". Accordingly, the counter 10 is set at a timing at which no through current flows in the sample circuit 11, so that a counter value is determined.

(Nonvolatile Memory Write Step)

After the counter value determination step, the counter value determined by the counter 10 is written in the nonvolatile memory 51 from the counter 10 while the write mode of the nonvolatile memory is active.

(Nonvolatile Memory Read Step)

While the read mode of the nonvolatile memory is active, the counter value written as data in the nonvolatile memory write step is read out from the nonvolatile memory 51 and the data is stored in the register 52.

(Register Read Step)

After the nonvolatile memory read step, while the read mode of the register is active, the data stored in the register 52 is read out from the register 52 and transferred to the selector 518.

(Selector Switch Step)

After the register read step, the selector 518 enables the output of the register 52 and transfers the data to the non-overlap circuit 3. At the same time, the selector 514 enables the output to the lines 43 so that output signals from the non-overlap circuit 3 are transferred to the internal circuits 42.

Figure 7B:
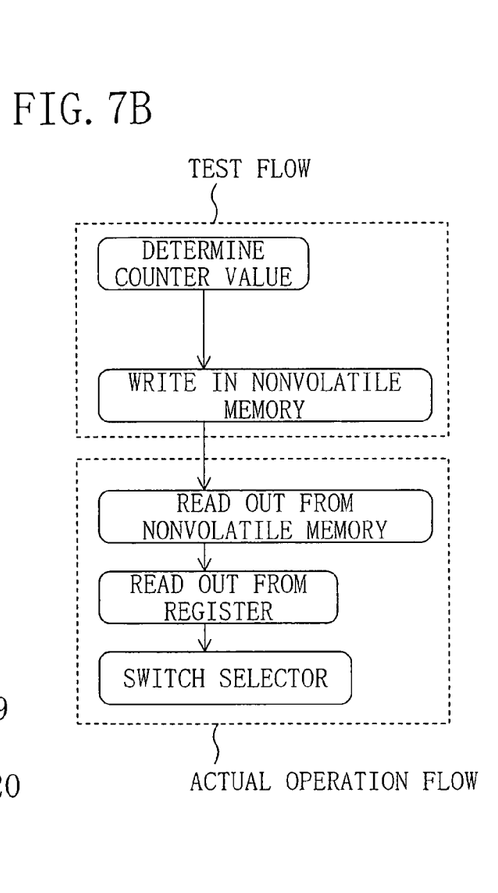
FIG. 7B is a flowchart showing operation of the semiconductor integrated circuit device of the fourth embodiment.

As shown in FIG. 7B, the counter value determination step through the nonvolatile memory write step are defined as a test flow executed during a test and the nonvolatile memory read step through the selector switch step are defined as an actual operation flow executed during actual circuit operation. Since the test flow is executed during a test for shipment and the actual operation flow is executed during actual operation, it is unnecessary to operate the sample circuit 11, the current detector 9, the current comparator 20 and the counter 10 during actual operation of the internal circuits 42. This is because the counter value of the counter 10 has been stored in the nonvolatile memory 51 before the test flow. As a result, the time necessary for the replica circuit 41' to start outputting an output signal to the respective internal circuits 42 through the lines 43 divided between the output nodes 12 and 13 at an optimum timing at which no through current flows is reduced. In addition, power consumption of the entire semiconductor integrated circuit system 300 is reduced.

In this embodiment, the sample circuit 11, the current detector 9, the current comparator 20 and the counter 10 only need to be provided during the test for shipment and are not needed during actual operation. Accordingly, the sample circuit 11, the current detector 9, the current comparator 20 and the counter 10 may be provided as external components only during the test for shipment. In such a case, the sample circuit 11, the current detector 9, the current comparator 20 and the counter 10 do not need to be placed in the semiconductor integrated circuit system 300, so that the space occupied by the semiconductor integrated circuit system 300 is reduced.

Embodiment 5

In a fifth embodiment of the present invention, preferred applications of the first through fourth embodiments will be described.

A typical application of the first through fourth embodiments is a system including one of the semiconductor integrated circuit device 100 and the replica circuits 41 and 41' of the foregoing embodiments.

First, as a first example of application, a power consumption monitor for monitoring power consumption of a system and causing one of the semiconductor integrated circuit device 100 and the replica circuits 41 and 41' to operate when power consumption reaches or exceeds a reference value may be provided in the system to operate the semiconductor integrated circuit device 100. Then, power consumption of the system is reduced and operation speed of the system is increased.

As a second example of application, a system workload monitor for monitoring an actual workload of a system including one of the semiconductor integrated circuit device 100 and the replica circuits 41 and 41' of the foregoing embodiments and causing the semiconductor integrated circuit device 100 or the replica circuit 41 or 41' to operate in accordance with the system workload may be provided.

Figure 8:
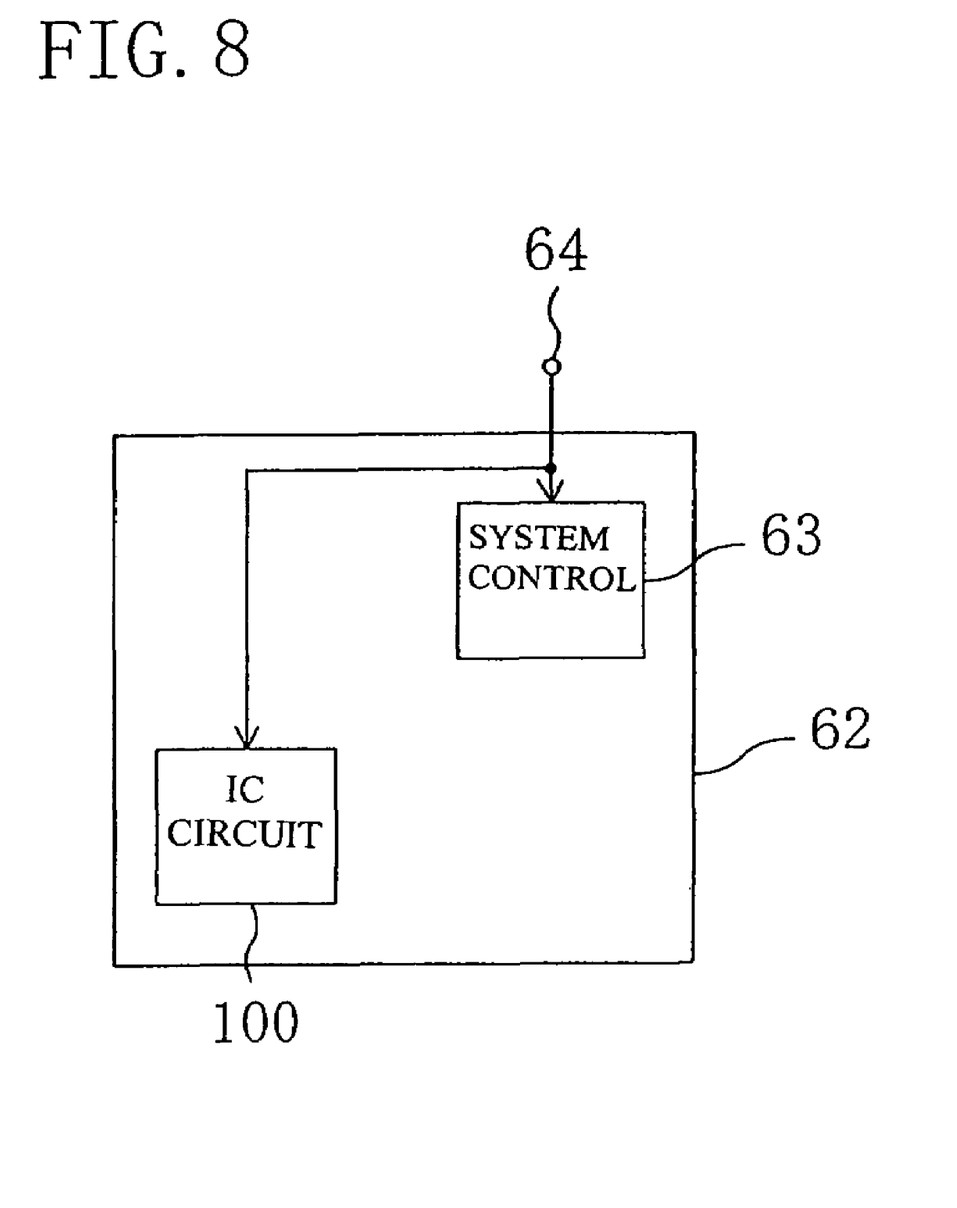
FIG. 8 is a diagram illustrating a system as an example of application of the present invention.

As a third example of application is a system 62 including the semiconductor integrated circuit device 100 of the first embodiment, a system control device 63 and a system-operation-mode input terminal 64 as shown in FIG. 8. In the system 62, a system-operation-mode signal is input to the semiconductor integrated circuit device 100 and the system control device 63 at the same time. Accordingly, an EN signal to the semiconductor integrated circuit device 100 may be set at "H" in a specific system operation mode such that the semiconductor integrated circuit device 100 operates only in this specific system operation mode. In this manner, power consumption and operation speed of the system 62 are switched when necessary, resulting in that the efficiency is enhanced, power consumption is reduced and operation speed is increased in the entire system.

Alternatively, a system current value monitor for always monitoring an average current value of a system including one of the semiconductor integrated circuit device 100 and the replica circuits 41 and 41' of the foregoing embodiments and causing the semiconductor integrated circuit device 100 or the replica circuit 41 or 41' to operate such that the average current value is always equal to or smaller than a reference value may be provided.

Embodiment 6

Figure 9:
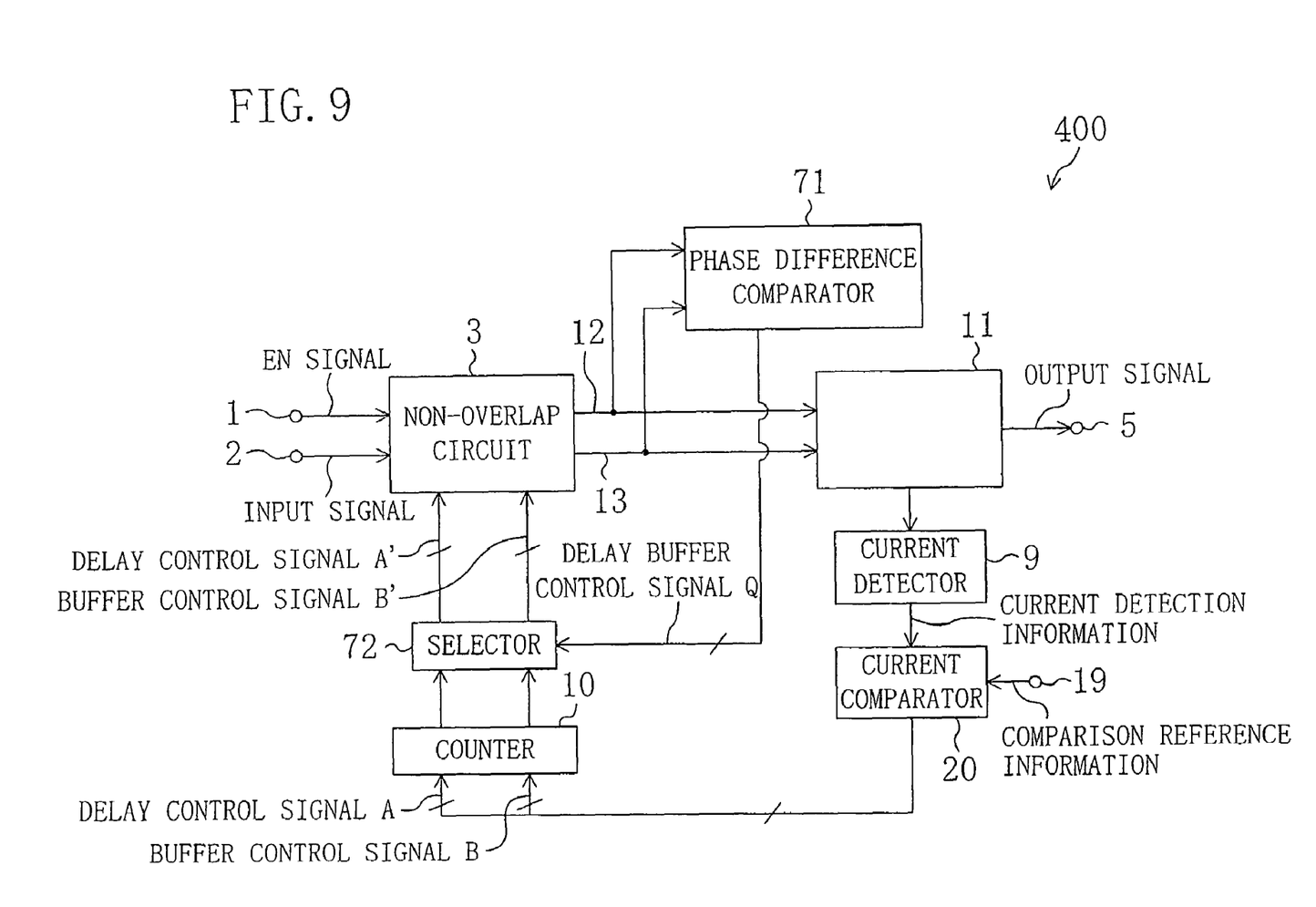
FIG. 9 is a block diagram illustrating a configuration of a semiconductor integrated circuit device according to a sixth embodiment of the present invention.

FIG. 9 is a block diagram illustrating a configuration of a semiconductor integrated circuit device according to a sixth embodiment of the present invention.

As shown in FIG. 9, a semiconductor integrated circuit device 400 of this embodiment includes: a non-overlap circuit 3; a phase difference comparator 71; a sample circuit 11; a current detector 9; a current comparator 20; a counter 10; and a selector 72. The non-overlap circuit 3, the sample circuit 11, the current detector 9, the current comparator 20 and the counter 10 have the same configurations as those of the first embodiment.

The phase difference comparator 71 outputs, to the selector 72, a delay buffer control signal Q according to input signals from output nodes 12 and 13 of the non-overlap circuit 3.

When a select mode is active, the selector 72 enables the delay buffer control signal Q, and a delay control signal A' and a buffer control signal B' are input to the non-overlap circuit 3.

In this embodiment, the phase difference comparator 71 detects the phase difference between output signals from the output nodes 12 and 13 of the non-overlap circuit 3, compares the detected phase difference with a predetermined reference phase different, and outputs a delay buffer control signal Q in accordance with a result of the comparison. The delay buffer control signal Q is fed back to the non-overlap circuit 3 by way of the selector 72, so that the phase difference between output signals from the output nodes 12 and 13 of the non-overlap circuit 3 is quickly adjusted to the reference phase difference.

Accordingly, unlike conventional techniques, it is unnecessary to set the timing of switching at the design stage. As a result, a margin does not need to be previously estimated when the timing of switching is set, so that decrease of operation speed caused by an excessive margin is prevented. That is, in this embodiment, a semiconductor integrated circuit device operating at high speed is implemented. In addition, in this embodiment, after setting of the counter 10 so as not to cause through current to flow, power consumption is also reduced by stopping operation of the current detector 9 and the current comparator 20.

The phase difference between output signals from the output nodes 12 and 13 of the non-overlap circuit 3 may be previously input to the phase difference comparator 71 so that a delay buffer control signal Q is generated and fed back to the non-overlap circuit 3. In this case, the phase difference between the output nodes 12 and 13 is capable of being fed back to the non-overlap circuit 3 as a reference.

Embodiment 7

Figure 10:
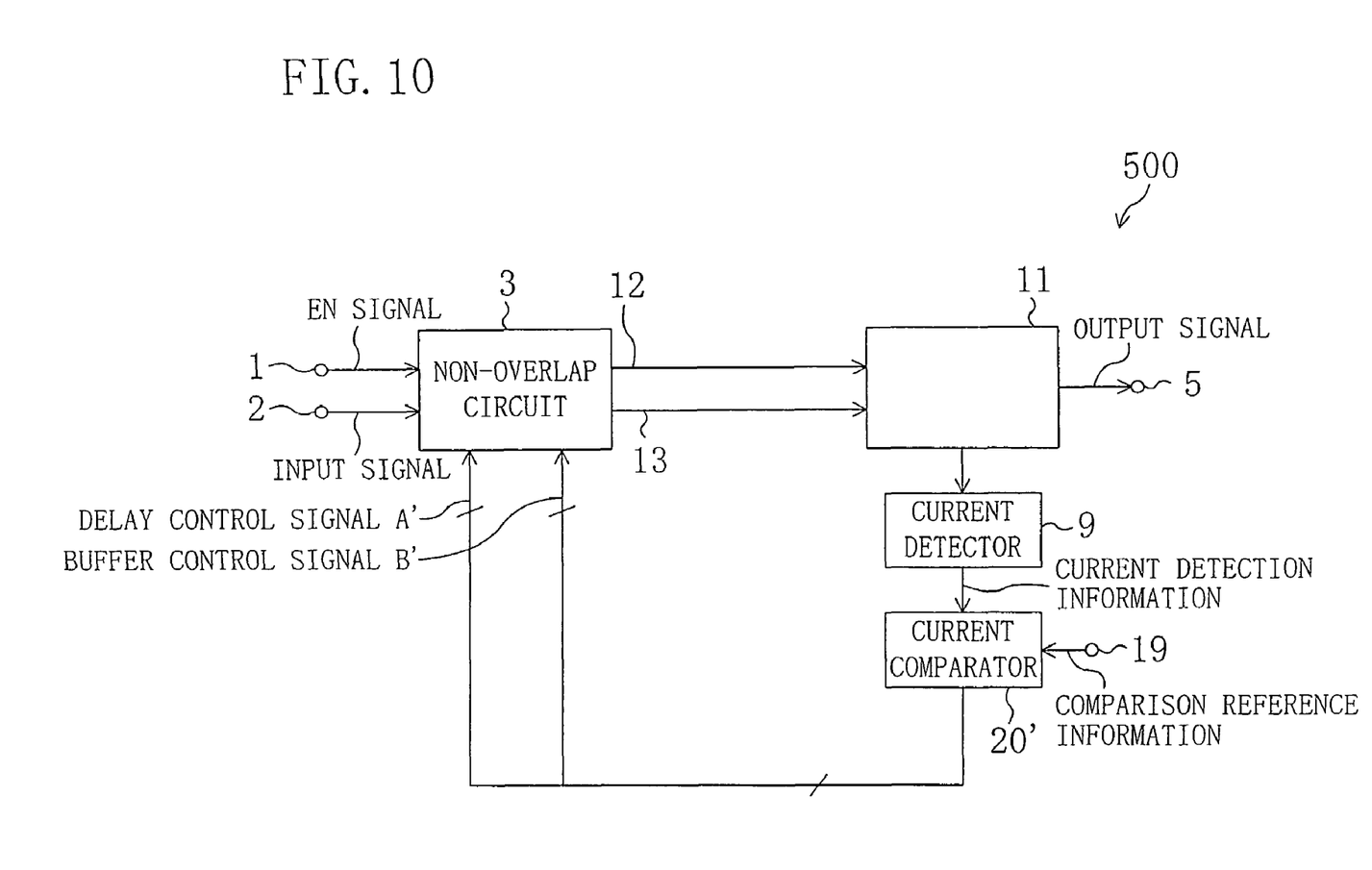
FIG. 10 is a block diagram illustrating a configuration of a semiconductor integrated circuit device according to a seventh embodiment of the present invention.

FIG. 10 is a block diagram illustrating a semiconductor integrated circuit device according to a seventh embodiment of the present invention.

As shown in FIG. 10, a semiconductor integrated circuit device 500 of this embodiment includes: a non-overlap circuit 3; a sample circuit 11; a current detector 9; and a current comparator 20' and has substantially the same configuration as that of the semiconductor integrated circuit device 100 of the first embodiment. The semiconductor integrated circuit device 500 is different from the semiconductor integrated circuit device 100 in that the current comparator 20' is provided instead of the current comparator 20 and no counter is provided.

In the semiconductor integrated circuit device 500, the current comparator 20' calculates the difference in current value between comparison reference information input from an input terminal 19 and current detection information, generates a delay control signal A' and a buffer control signal B', and returns these signals to the non-overlap circuit 3. The delay control signal A' and the buffer control signal B' generated from the current value difference are used to determine the degree of the phase difference between output nodes 12 and 13. For example, the current comparator 20' is set to generate the delay control signal A' and the buffer control signal B' in such a manner that the phase difference between the output nodes 12 and 13 is large when the current value difference is large and the phase difference is small when the current value difference is small. The current comparator 20' may, of course, be set to generate the delay control signal A' and the buffer control signal B' in such a manner that the phase difference between the output nodes 12 and 13 is small when the current value difference is large and the phase difference is large when the current value difference is small.

With the foregoing configuration, in the semiconductor integrated circuit device 500 of this embodiment, it is possible to quickly set optimum switching timings of output signals from the output nodes 12 and 13.

The current comparator 20' may be configured such that a current value difference is input to the current comparator 20' beforehand to allow the switching timings of output signals from the output nodes 12 and 13 to be adjustable from the outside at any time. In this case, even after fabrication of the semiconductor integrated circuit device 500, the switching timing of output signals from the output nodes 12 and 13 can be adjusted.

Embodiment 8

Figure 11:
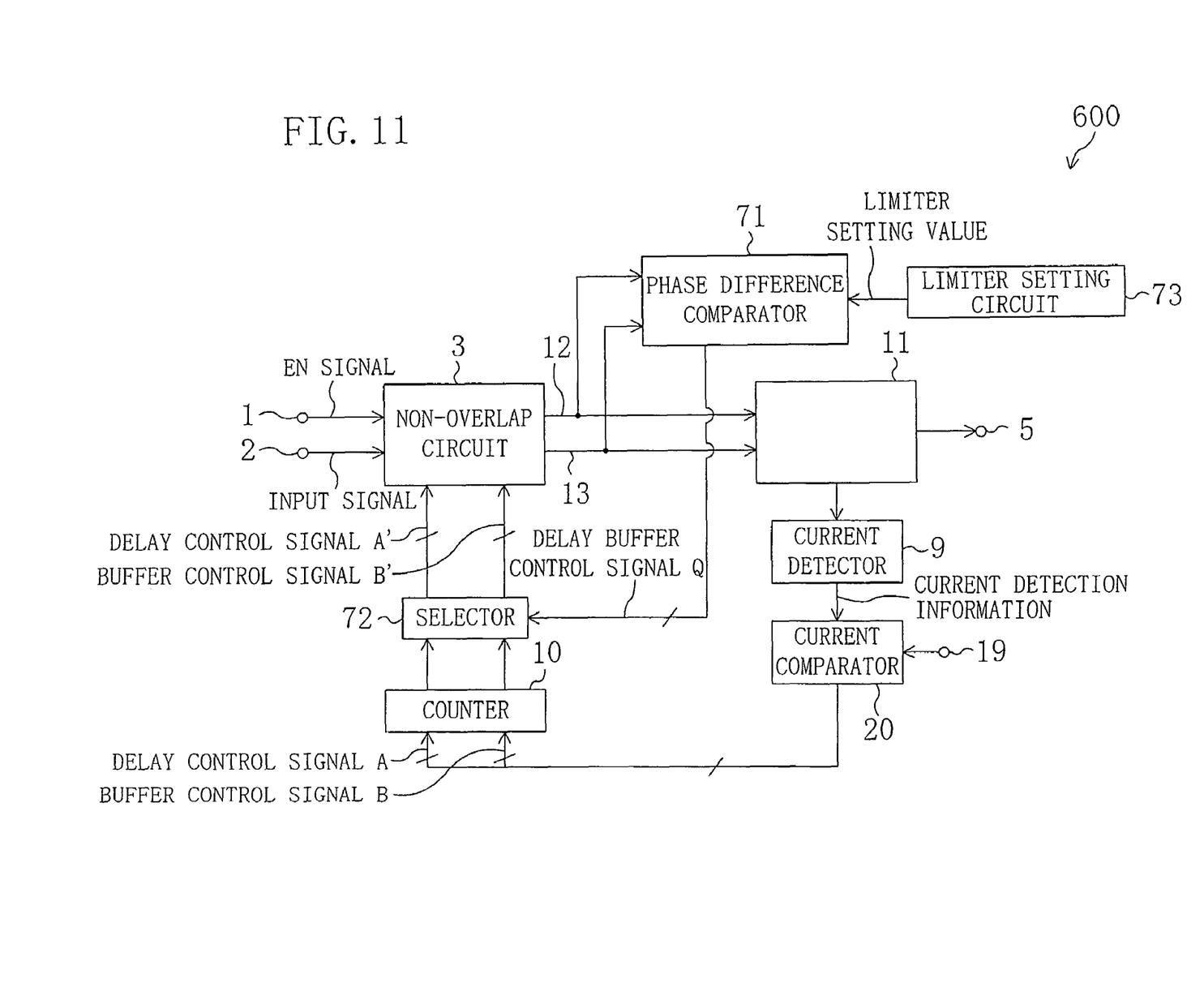
FIG. 11 is a block diagram illustrating a configuration of a semiconductor integrated circuit device according to an eighth embodiment of the present invention.

FIG. 11 is a block diagram illustrating a configuration of a semiconductor integrated circuit device according to an eighth embodiment of the present invention.

As shown in FIG. 11, a semiconductor integrated circuit device 600 of this embodiment includes: a non-overlap circuit 3; a phase difference comparator 71; a limiter setting circuit 73; a sample circuit 11; a current detector 9; a current comparator 20; a counter 10; and a selector 72 and has substantially the same configuration as that of the semiconductor integrated circuit device 400 of the sixth embodiment. The semiconductor integrated circuit device 600 is different from the semiconductor integrated circuit device 400 only in that the limiter setting circuit 73 is connected to the phase difference comparator 71.

The limiter setting circuit 73 outputs a limiter setting value and controls the phase difference comparator 71 so that the phase difference between output nodes 12 and 13 does not exceed the limiter setting value.

In the semiconductor integrated circuit device 600 of this embodiment, operation failures resulting from an excessive phase difference do not occur.

For the limiter setting circuit 73, the limiter setting value may be set beforehand or may be set at any time from the outside. In particular, if in the case where the limiter setting value is capable of being set at any time from the outside, it is possible to set the limiter setting value at any time after fabrication of the semiconductor integrated circuit device 600.

What is claimed is:

1. A semiconductor integrated circuit system, comprising:
a semiconductor integrated circuit device, comprising:
    a sample circuit in which through current to be monitored flows during switching between transistors;
    a non-overlap circuit for outputting an output signal for the switching in the sample circuit;
    a current detector for detecting the through current flowing during the switching; and
    a current comparator in which a reference current value with respect to the through current has been set and which compares a current value detected by the current detector with the reference current value and outputs a result of the comparison to the non-overlap circuit,
wherein the non-overlap circuit includes one of:
  a delay circuit for setting a delay time of the output signal for the switching based on the comparison result output from the current comparator; and
  a buffer for setting a transition time of the output signal for the switching,
  wherein each of the delay circuit and the buffer includes a plurality of transistors connected in parallel and having different channel widths and different channel lengths,
  an ability of each of the delay circuit and the buffer is changed by selecting at least one of the transistors, and the delay time or the transition time of the output signal for the switching in the sample circuit is adjusted by the change of the ability; and an internal circuit receiving an output signal from the non-overlap circuit, wherein the reference current value with respect to each condition such as power supply voltage, temperature and frequency is inputted into the current comparator, thereby being able to perform dynamic control of the integrated circuit device with respect to the change of the each condition.

* * * * *